United States Patent [19]

Yoshimura et al.

[11] Patent Number: 4,719,448

[45] Date of Patent: Jan. 12, 1988

[54] SEMICONDUCTOR A/D CONVERTER USING CHARGE COUPLED DEVICE

[75] Inventors: Osamu Yoshimura; Masahisa Nemoto, both of Tokyo, Japan

[73] Assignee: NEC Corporation, Japan

[21] Appl. No.: 791,229

[22] Filed: Oct. 25, 1985

[30] Foreign Application Priority Data

Oct. 30, 1984 [JP] Japan .................. 59-228608

[51] Int. Cl.⁴ .............................. H03M 1/44
[52] U.S. Cl. .................. 340/347 AD; 340/347 M; 357/24
[58] Field of Search ............. 340/347 AD, 347 M; 357/24

[56] References Cited

U.S. PATENT DOCUMENTS 3,955,191  5/1976  Lambourn ............. 340/347 AD X
4,136,335  1/1979  Tompsett ............. 340/347 M X
4,375,059  2/1983  Schlig .............. 340/347 M X

*Primary Examiner*—T. J. Sloyan
*Attorney, Agent, or Firm*—Laff, Whitesel, Conte & Saret

[57] ABSTRACT

An A/D converter has a transfer channel and a plurality of transfer electrodes for transferring a charge from the transfer channel in a predetermined direction. When the number of bits of the digital signal to be generated is n, the number of charge transfer stages is 2n. A ratio of the area of the last electrode of a given odd-numbered stage to that of the last electrode of the immediately preceding odd-numbered stage is 1:2. Each even-numbered transfer stage has a first transfer path for transferring a charge exceeding $\frac{1}{2}$ of the channel potential of the last electrode of the immediately preceding stage and a second transfer path for transferring a charge which does not exceed $\frac{1}{2}$ of the channel potential. The charge transferred to the first transfer path is detected. Transfer of the charge on the second transfer path to the next stage or sweeping thereof outside the charge transfer section is switched in accordance with the transfer charge detection signal. A charge detected by the mth (m is the even number) transfer stage is delayed by a delay network by (n+1−m/2) bits, thereby generating a digital signal.

4 Claims, 3 Drawing Figures

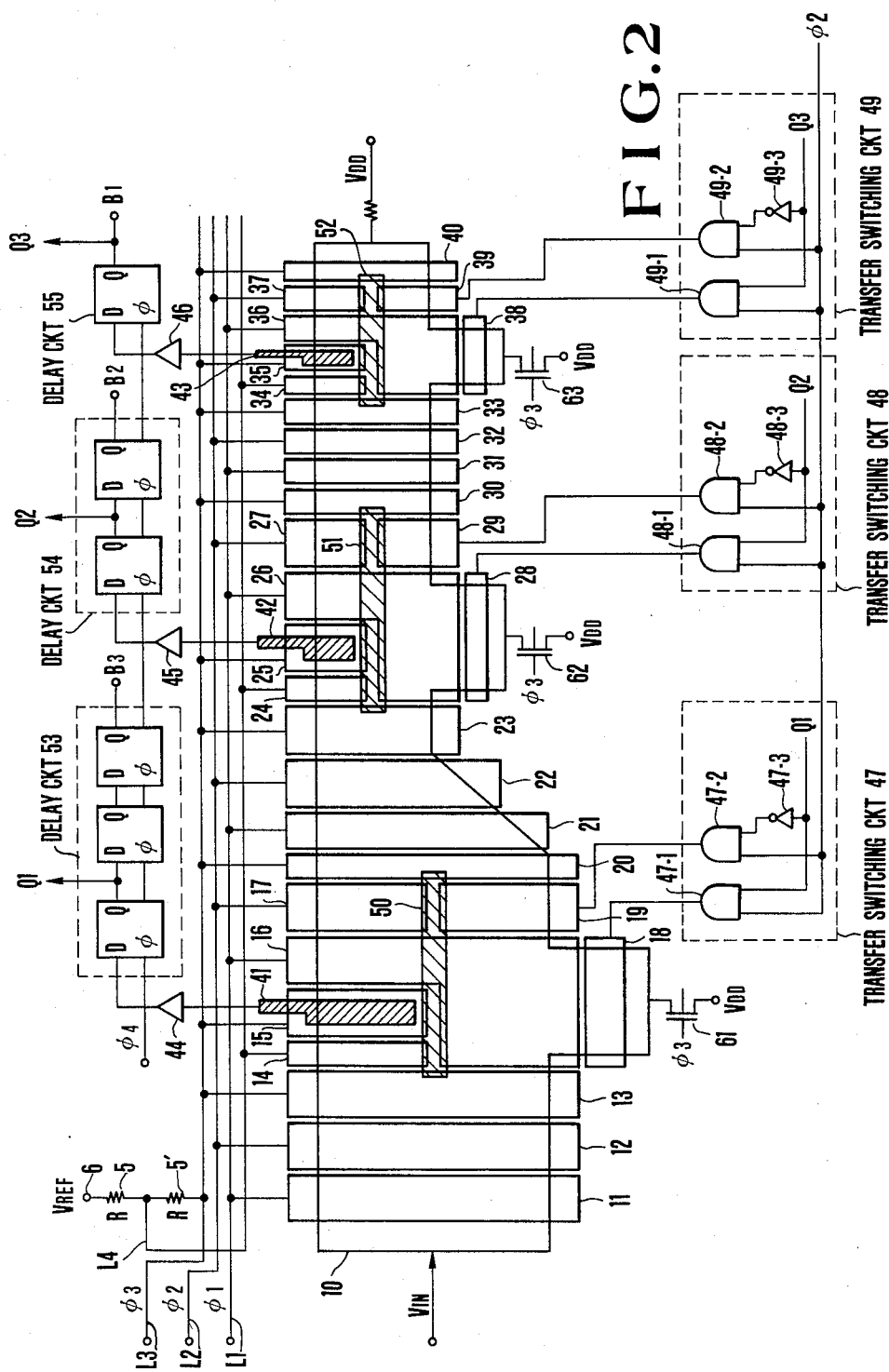

SEMICONDUCTOR A/D CONVERTER USING CHARGE COUPLED DEVICE

BACKGROUND OF THE INVENTION

The present invention relates to an A/D converter using a charge transfer device (CTD), especially a charge-coupled device (CCD).

A traveling-wave converter device is known as a high-speed A/D converter. A typical example of the basic circuit block of the traveling-wave converter device is shown in FIG. 1.

Referring to FIG. 1, an input analog signal VIN is supplied to one input terminal of a comparator 3, and a voltage VR half of the full-scale input analog signal VIN is applied to the other input terminal of the comparator 3. An output from the comparator 3 serves as an MSB (Most Significant Bit) which is then stored in a memory 6. At the same time, the MSB is supplied to a D/A converter 8 in response to a timing signal $\phi$. The D/A converter 8 generates a $\frac{3}{4}$ or $\frac{1}{4}$ voltage of the full-scale input analog signal VIN in accordance with data of logic "1" or "0" from the memory 6. An output from the converter 8 is supplied to one input terminal of a comparator 4. A delayed input analog signal VIN is supplied to the other input terminal of the comparator 4. The comparator 4 compares the delayed input analog signal VIN with the output from the converter 8. A comparison result determines the next bit which is then stored in a memory 7. The above operation is repeated to sequentially determine lower bits.

In the conventional A/D converter of this type, since comparators and D/A converters are used, the delay times of the delay circuits must be set with high precision. Errors in delay circuits degrade A/D conversion precision. Furthermore, in the conventional device, different reference voltages are required for the comparators, respectively, thus resulting in a complex circuit arrangement.

SUMMARY OF THE INVENTION

It is an object of the present invention to provide a simple CCD A/D converter using a charge-coupled device (to be referred to as a CCD hereinafter) to be compatible with a high-speed analog input signal.

In order to achieve the above object of the present invention, there is provided an A/D converter comprising: charge transfer means including a transfer channel serving as a charge shift path and a plurality of transfer electrodes aligned on the transfer channel along a transfer direction and adapted to transfer a charge in a predetermined direction upon reception of a predetermined transfer clock signal, the charge transfer means being provided with 2n (where n is the number of bits of a digital signal to be generated) charge transfer stages each of which includes the plurality of transfer electrodes, an area of a last transfer electrode of an odd-numbered one of the plurality of charge transfer stages being $\frac{1}{2}$ of an area of a last transfer electrode of an immediately preceding odd-numbered one of the plurality of charge transfer stages, respectively, even-numbered ones of the plurality of charge transfer stages being provided with a first charge transfer path for transferring a charge at a channel potential exceeding a predetermined level and a second charge transfer path for transferring a charge below the channel potential; charge detecting means for detecting the charge transferred along the first charge transfer path at each even-numbered charge transfer stage; charge transfer switching means for switching between transfer of the charge on the second charge transfer path to a next one of the plurality of charge transfer stages and sweeping of the charge outside the charge transfer means from the second charge transfer path in accordance with an output signal from the charge detecting means; and a delay circuit for delaying each output signal from the charge detecting means for an mth (where m is an even number) transfer stage by $(n+1-m/2)$ and generating each bit of the digital signal.

BRIEF DESCRIPTION OF THE DRAWINGS

FIG. 2 is a diagram of an A/D converter according to an embodiment of the present invention.

DETAILED DESCRIPTION OF THE PREFERRED EMBODIMENT

The present invention will be described in detail with reference to the accompanying drawings.

Figure 1:
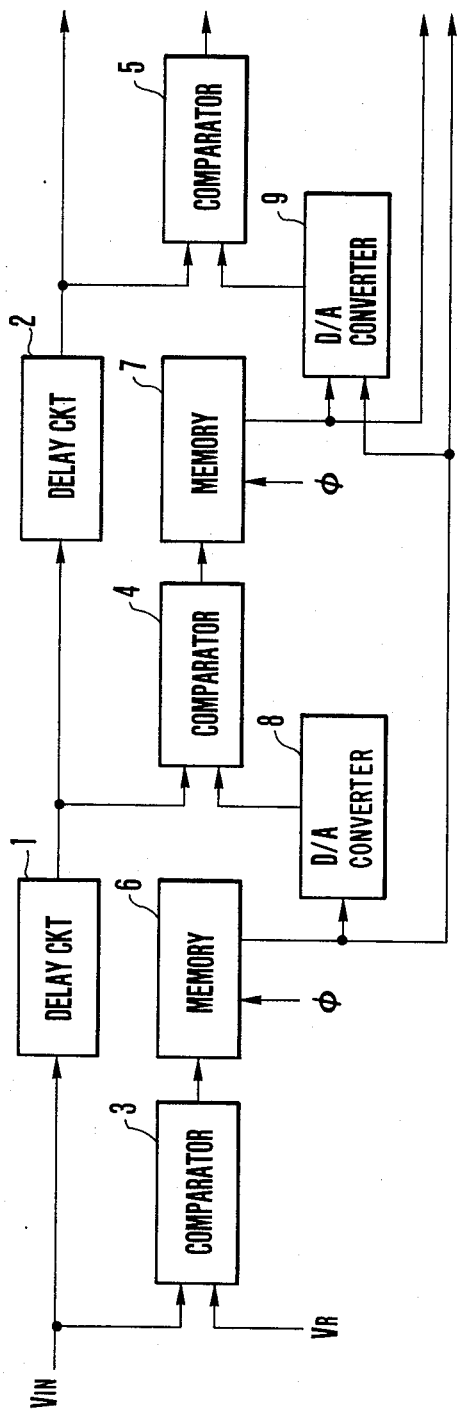
FIG. 1 is a block diagram showing a schematic arrangement of an A/D converter used in the related art.
Figure 3:
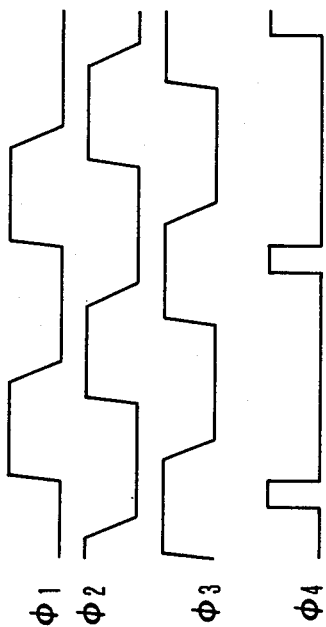
FIG. 3 is a timing chart of timing signals in the device of FIG. 2.

FIG. 2 shows a 3-bit CCD A/D converter using a three-phase clock according to an embodiment of the present invention. Reference numerals L1, L2 and L3 denote three-phase clock signal lines which receive external clock signals $\phi 1$, $\phi 2$ and $\phi 3$ of FIG. 3, respectively. The line L3 is connected to a terminal 6 of a reference voltage VREF through a series circuit of resistors 5 and 5' having the identical resistance. A joint between the resistors 5 and 5' is connected to a line L4, and a voltage at the line L4 is set to be $\frac{1}{2}$ of that at the line L3. Reference numerals 11 to 40 denote CCD transfer electrodes (to be referred to as electrodes hereinafter). The electrodes 11 to 13 constitute a first transfer stage; 14 to 20, a second transfer stage; 21 to 23, a third transfer stage; 24 to 30, a fourth transfer stage; 31 to 33, a fifth transfer stage; and 34 to 40, a sixth transfer stage. Reference numeral 10 denotes a CCD transfer channel formed by a p-channel semiconductor layer, so that a charge to be transferred is constituted by electrons. The transfer channel 10 under the even-numbered stage electrodes is divided into first and second (upper and lower portions in FIG. 2) transfer paths by channel stoppers 50, 51 and 52. Since a potential well is not formed in regions of the channel stoppers 50–52, irrespective of the potentials on the electrodes thereabove, movement of charges from the first transfer path to the second path or vice versa is inhibited.

The first electrodes (i.e., the electrodes 11, 21 and 31), the second electrodes (i.e, the electrodes 12, 22 and 32) and the third electrodes (i.e., the electrodes 13, 23 and 33) are connected to the lines L1, L2 and L3, respectively. The area of the last electrode 23 of the third transfer stage is $\frac{1}{2}$ that of the last electrode 13 of the first transfer stage. The area of the last electrode 33 of the fifth transfer stage is $\frac{1}{2}$ that of the last electrode 23 of the third transfer stage. In general, the charge potential under the last electrode of the lth transfer stage (where l is an odd number of 3 or more) is twice that at the last electrode of the (l−2)th transfer stage.

The first electrodes 14, 24 and 34 of the first transfer path of each even-numbered transfer path are connected to the line L4; the second electrodes 15, 25 and 35, to the line L3; the third electrodes 16, 26 and 36, to the line L1; the fourth electrodes 17, 27 and 37, to the line L2; and the fifth electrodes 20, 30 and 40, to the line L3.

The electrodes 16, 26 and 36 are common in the first and second transfer paths and extend for distances corresponding to the respective lengths of the first and second electrodes in the first transfer path or the second transfer path of the even-numbered transfer stages. The electrodes 18, 28 and 38 are formed at the outermost portions of the second transfer path and are connected to output terminals of AND gates 47-1, 48-1 and 49-1 of charge transfer switching circuits 47, 48 and 49 (to be described later), respectively. The electrodes 19, 29 and 39 are formed at the positions opposite to the fourth electrodes 17, 27 and 37 of the first transfer path on the second transfer path, and have the same size. The electrodes 19, 29 and 39 are connected to output terminals of AND gates 47-2, 48-2 and 49-2 of the circuits 47, 48 and 49. The last electrodes 20, 30 and 40 are common to both the transfer paths. Reset electrodes 61, 62 and 63 controlled in response to a signal $\phi 3$ are connected to the outermost end of the second transfer path of each even-numbered transfer stage.

Floating gates 41, 42 and 43 are formed between the transfer channel and the second electrodes 15, 25 and 35 of each even-numbered transfer stage, respectively. The floating gates 41, 42 and 43 are connected to input terminals of delay circuits 53, 54 and 55 through amplifiers 44, 45 and 46, respectively. The delay circuits 53, 54 and 55 comprise a three-series connected flip-flop circuit, a two-series connected flip-flop circuit and a single flip-flop, respectively. The delay circuits 53, 54 and 55 delay the input signals by three, two and one periods of the signal $\phi 4$ synchronous with the signal $\phi 3$, and generate digital signals at output terminals B3, B2 and B1, respectively. Output signals Q1, Q2 and Q3 from the first D flip-flops of the delay circuits 53, 54 and 55 are used as charge detection signals which are supplied to the charge transfer switching circuits 47, 48 and 49, respectively. The signals Q1, Q2 and Q3 are supplied to first input terminals of the AND gates 47-1, 48-1 and 49-1 and are inverted by inverters 47-3, 48-3 and 49-3, respectively. The inverted signals are supplied to first input terminals of the AND gates 47-2, 48-2 and 49-2, respectively. The transfer clock signal $\phi 2$ is supplied to the second input terminals of the AND gates 47-1, 47-2, 48-1, 48-2, 49-1 and 49-2. When the signal Q1 is set at logic "0", the electrode 19 is operated in response to the signal $\phi 2$. Similarly, when the signal Q1 is set at logic "1", the electrode 18 is operated in response to the signal $\phi 2$.

The operation of the A/D converter having the arrangement as described above with reference to FIG. 2 will now be described.

An analog signal VIN is injected as charge storage into a channel under the first electrode 11 of the first transfer stage at the leading edge of the transfer clock signal $\phi 1$. For the sake of simplicity, assume that the charge storage completely saturates a channel potential well region constituted by the electrode 11 when the input analog signal has a maximum level.

A charge injection in proportion to the magnitude of the input analog signal is transferred below the electrode 12 at the leading edge of the transfer clock signal $\phi 2$. Furthermore, the charge is transferred below the electrode 13 at the leading edge of the transfer clock signal $\phi 3$. At this time, a half of the voltage at the electrode 13 is applied to the first electrode 14 of the second transfer stage, and the same voltage as that appearing at the electrode 13 is applied to the electrode 15. In this state, a potential barrier having a half of the depth of the well formed between the electrodes 13 and 15 is formed therebetween. When a charge transferred below the electrode 13 includes a charge portion thereof having potential exceeding a potential barrier formed by the electrode 14, only the charge portion passes under the electrode 14 and is stored under the more stable electrode 15 while another charge portion having a potential not exceeding the potential barrier remains under the electrode 13. The fact that the charge stored under the electrode 15 is present indicates that the sampled analog signal has a magnitude larger than ½ of the full-scale of the input analog signal. On the contrary, if no charge is stored under the electrode 15, it indicates that the sampled analog signal has a magnitude which is smaller than ½ of the full-scale of the input analog signal. Whether a charge exists under the electrode 15 or not is detected by the floating gate 41, and a detection signal is stored as an MSB (Most Significant Bit) value in the delay circuit 53. In this case, since the detection signal has a small magnitude, it is amplified by the amplifier 44. The write access of the memory 53 is synchronized with the leading edge of the signal $\phi 4$ synchronized with the signal $\phi 3$.

The aforementioned remaining charge portion under the electrode 13, having a potential below the potential barrier, is transferred in its entirety to the second transfer path under the electrode 16, divided by the channel stopper 50 at the timing of the next clock signal $\phi 1$. This charge is required only when no charge is present under the electrode 15 (i.e., only when a detected logic level is "0"). In this case, the output signal Q1 from the delay circuit 53 is set at logic "0". In response to the signal Q1, the charge transfer switching circuit 47 transfers the charge stored under the second transfer path of the electrode 16 to the electrode 19 at the leading edge of the clock signal $\phi 2$. However, when the detected logic level is "1", i.e., when the signal Q1 is set at logic "1", the charge under the second transfer path of the electrode 16 is not used for bit determination but transferred to the electrode 18 at the leading edge of the clock signal $\phi 2$ and swept out to a reset electrode (i.e., the high-voltage VDD electrode) 61 at the leading edge of the clock signal $\phi 3$.

At the leading edge of the signal $\phi 2$, the charge is always transferred to one of the electrodes 17 and 19. When the charge is transferred below the electrode 17, the sampled analog signal indicates that it has a magnitude larger than ½ that of the full-scale input analog signal by a value proportional to the charge. However, when the charge is transferred below the electrode 19, the sampled analog signal indicates that it has a magnitude smaller than ½ that of the full-scale analog signal and is proportional to the charge. The charge is transferred to the electrode 20 at the leading edge of the clock signal $\phi 3$ and serves as an input charge for the third transfer stage.

The charge transferred to the third transfer stage is sequentially transferred in the same manner as described above and is stored under the electrode 23. Only the charge component which exceeds the potential barrier formed by the electrode 24 is stored under the electrode 25. The potential barrier of the electrode 14 has substantially the same height as that of the electrode 24, but the electrode 23 has a ½ area of the electrode 13. The charge potential stored under the electrode 23 is thus doubled as compared with the electrode 13 (for example, when water contained to a level h' in a container having a height h and a bottom surface area a is poured in another container having a bottom surface area a/2, the water level is 2h'; this can be applied to the charge potential described above such that a is the surface area of the electrode and ah' is the charge storage). The voltages at the barrier electrodes 14, 24 and 34 may be identical. In other words, only one reference voltage is required.

The charge potential is doubled to sequentially determine the lower bits. When an LSB (Least Significant Bit) is determined, the bit values are delayed by the corresponding delay circuits 53, 54 and 55 in response to the clock signal $\phi 4$ and can be simultaneously extracted as a digital signal at the output terminals B3, B2 and B1.

As may be apparent from the above description, unlike in the conventional A/D converter, neither comparators nor D/A converters are used, so that the input analog signal need not be delayed with high precision. The input analog signal can be easily delayed in synchronism with the transfer clock of the CCD. Therefore, the delay circuits can be simplified and easily operated. Although different reference voltages are required for bit determination in the conventional A/D converter, the area of the last electrode of each odd-numbered transfer stage is set to be ½ that of the last electrode of the immediately preceding odd-numbered transfer stage, and thus the charge potential can be doubled. Therefore, only one reference voltage is required. This leads to simplicity of the system configuration and structure. A time required for converting the analog signal to the digital signal can be increased when the resolution is increased (i.e., when the number of output bits is increased). However, the sampling rate depends on only the transfer rate (i.e., the transfer clock rate) of the CCD and not on the resolution, thus providing a great industrial advantage.

What is claimed is:

1. An A/D converter comprising: charge transfer means including a transfer channel serving as a charge shift path and a plurality of transfer electrodes aligned on said transfer channel along a transfer direction and adapted to transfer a charge in a predetermined direction upon reception of a predetermined transfer clock signal, said charge transfer means being provided with 2n (where n is the number of bits of a digital signal to be generated) charge transfer stages each of which includes said plurality of transfer electrodes, an area of a last transfer electrode of an odd-numbered one of said plurality of charge transfer stages being ½ of an area of a last transfer electrode of an immediately preceding odd-numbered one of said plurality of charge transfer stages, respectively, even-numbered ones of said plurality of charge transfer stages being provided with a first charge transfer path for transferring a charge at a potential exceeding a predetermined channel potential and a second charge transfer path for transferring a charge below the channel potential to parallel process the charges having respective potentials exceeding and not exceeding the predetermined charge potential; charge detecting means for detecting the charge transferred along said first charge transfer path at each even-numbered charge transfer stage and generating a charge detection signal representing a value of bit; charge transfer switching means for switching between transfer of the charge on said second charge transfer path to a next one of said plurality of charge transfer stages and sweeping of the charge outside said charge transfer means from said second charge transfer path in accordance with an output signal from said charge detecting means; and a delay circuit for delaying each output signal from said charge detecting means for an mth (where m is an even number) transfer stage by $(n+1-m/2)$ and generating each bit value of the digital signal.

2. An A/D converter according to claim 1, wherein said delay means corresponding to said mth (where m is an even number) transfer stage comprises a series circuit of $(n+1-m/2)$ D flip-flops, each of said flip-flops being applied with a clock signal synchronized with the transfer clock signal so as to provide to an output bit a delay synchronized with the transfer clock, thereby obtaining the charge detection signal from an output from a first one of said flip-flops and the digital signal from an output from a last one of said flip-flops.

3. An A/D converter according to claim 1, wherein the predetermined channel potential is ½ that of said last transfer electrode of said odd-numbered transfer stage and is supplied to a first electrode of said even-numbered transfer stage on said first transfer path.

4. An A/D converter according to claim 1, wherein said charge transfer switching means generates two signals with phases opposite to each other in accordance with a value of the output signal from said charge detecting means, one of said two signals being supplied to one of said electrodes of a corresponding one of said even-numbered transfer stages which is formed on said second transfer path and which is adjacent to the next odd-numbered transfer stage, and the other is being supplied to an electrode formed on said second transfer path and adjacent to a reset electrode.

* * * * *